United States Patent
Ireland (10) Patent No.: US 6,880,243 B2
(45) Date of Patent: Apr. 19, 2005

(54) STIFFENER FOR STIFFENING A CIRCUIT BOARD

(75) Inventor: John A. Ireland, Jasper (CA)

(73) Assignee: Sanmina-SCI Corporation, Huntsville, AL (US)

(*) Notice: Subject to any disclaimer, the term of this patent is extended or adjusted under 35 U.S.C. 154(b) by 73 days.

(21) Appl. No.: 10/264,362

(22) Filed: Oct. 4, 2002

(65) Prior Publication Data

US 2005/0028360 A1   Feb. 10, 2005

(51) Int. Cl.[7] .................... H05K 3/34; H05K 3/30; H05K 5/06
(52) U.S. Cl. ............. 29/840; 29/846; 29/426.1; 29/525.03; 361/809; 361/752; 361/748; 174/255; 174/250; 211/41.17; 428/573
(58) Field of Search .............. 29/840, 846, 426.1, 29/525.03; 228/37, 180.1; 174/135, 255, 174/250; 269/903; 428/573, 598, 99, 120; 361/752, 361/825, 748, 809; 211/41.17

(56) References Cited

U.S. PATENT DOCUMENTS

| | | | |
|---|---|---|---|
| 3,977,075 A | 8/1976 | Lynch et al. | |
| 4,452,359 A | 6/1984 | Koppensteiner | |
| 4,533,978 A * | 8/1985 | Walter | 361/809 |
| 4,988,577 A | 1/1991 | Jamieson | |
| 5,133,118 A | 7/1992 | Lindblad et al. | |
| 5,186,377 A | 2/1993 | Rawson et al. | |
| 5,198,279 A | 3/1993 | Beinhaur et al. | |
| 5,245,509 A | 9/1993 | Seitz | |
| 5,378,545 A | 1/1995 | Akulow | |
| 5,412,538 A | 5/1995 | Kikinis et al. | |
| 5,445,450 A | 8/1995 | Hayes et al. | |
| 5,784,263 A * | 7/1998 | Nelson | 361/785 |
| 5,873,162 A | 2/1999 | Acciai et al. | |
| 5,958,556 A | 9/1999 | McCutcheon | |
| 6,084,182 A | 7/2000 | Rehlander | |
| 6,094,358 A | 7/2000 | Christensen et al. | |
| 6,122,815 A | 9/2000 | Kownacki et al. | |
| 6,123,554 A | 9/2000 | Ortega et al. | |
| 6,155,433 A | 12/2000 | Anderson et al. | |
| 6,238,245 B1 | 5/2001 | Stokoe et al. | |
| 6,260,265 B1 | 7/2001 | Kownacki et al. | |
| 6,276,041 B1 | 8/2001 | Boe | |
| 6,285,563 B1 | 9/2001 | Nelson et al. | |
| 2001/0018799 A1 | 9/2001 | Lauffer et al. | |
| 2002/0141165 A1 * | 10/2002 | Sims et al. | 361/752 |

* cited by examiner

*Primary Examiner*—Minh Trinh
(74) *Attorney, Agent, or Firm*—Lanier Ford Shaver & Payne P.C.

(57) ABSTRACT

A printed circuit board stiffener is provided comprising a generally U-shaped elongated horizontal assembly having a substantially horizontal surface, an elongated vertical member extending downward from and rigidly coupled to one of the elongated horizontal assembly members opposite the assembly's curved edge and having a plurality of legs extending from the elongated vertical member, each such leg further comprising a flange extending substantially perpendicular to its respective plurality of legs in a direction toward the elongated horizontal assembly's curved edge. Each of said flanges are suitable for attachment to a surface of a circuit board. Further, such stiffener is capable of being moved, oriented, placed and mechanically bonded to the printed circuit board using existing SMT robotic assemblies.

15 Claims, 7 Drawing Sheets

STIFFENER FOR STIFFENING A CIRCUIT BOARD

BACKGROUND

1. Field of the Invention

The present invention relates generally to mechanical devices useful to strengthen circuit boards and, more specifically, to a circuit board stiffener that can be applied utilizing Surface Mount Technology (SMT).

2. Description of the Related Art

Printed circuit boards (PCBs) are well known in the art. PCBs are typically very thin and made of layers of glass fabrics or fibers that are bonded together by resins. The thinness of a PCB provides an advantage in that the PCB does not consume much space. But, one drawback is that, due to its thinness, the PCB is rather flimsy and not structurally stable. The thinness of the PCB can make the board and it's connected circuit components vulnerable to shock and vibration. Such shock and vibration can lead to damage or breakage in service or during the mating of the PCB assembly (PCBA) with other PCBAs, other parts of the final assembly, or during the end-use of the product. Furthermore, conventional soldering processes used during the PCBA manufacturing process provide a source of heat that can soften or warp the PCB, which can cause the soldering to be uneven.

Various devices exist and are currently used in industry to provide stiffness and structural strength to PCBs. Many of these stiffeners are made of either plastic, stamped steel, or cast metals in one form or another. Typically, the stiffeners are mounted or attached to the PCB using conventional mechanical fasteners, such as screws and rivets, via a labor-intensive, manual process. In some instances, the stiffeners are soldered to the PCB, but, again, using a labor-intensive, manual process.

One drawback of the labor-intensive processes used to manually attach the stiffener to the PCB is the additional cost and time introduced to the PCBA manufacturing process. Another drawback is the inherent quality problems associated with the manual process. For example, using screws to attach the stiffener to the PCB introduces problems associated with maintaining proper screw torque. Excessive torque can damage the PCB while inadequate torque can cause shaking and loss of retention. Using rivets typically involve the use of a suitable riveting machine. These riveting machines typically require manual setup and loading, which can add additional time and, hence, expense to the manufacturing process. Even using these riveting machines, one still is faced with the problem of insuring that the rivet is not too tight or too loose.

What is desired is an automatic process for attaching a stiffener to a PCB without introducing substantial cost and expense to existing PCBA manufacturing processes. Furthermore, a stiffener suitable for being automatically attached to a PCB using machinery typically used in a PCBA manufacturing process is also desired.

SUMMARY OF THE INVENTION

The present disclosure is directed to a stiffener suitable for automated attachment to a PCB and, a method for mechanically attaching the stiffener to the PCB, which substantially reduces or eliminates the disadvantages and problems associated with the manual process of attaching the stiffener described above. One technical advantage of the present invention includes providing a stiffener that is suitable for being quickly and efficiently attached to a PCB during a conventional Surface Mount Technology (SMT) process. The stiffeners of the present invention are suitable for handling by conventional SMT machinery. Another technical advantage of the present invention includes providing a process for automatically attaching the stiffener to the PCB utilizing a conventional SMT process. Utilizing SMT to attach the stiffener to the PCB provides control, consistency, and quality not found in current manual processes, and thus, eliminates or reduces the expense and time associated with current manual processes.

Additional objects and advantages of the invention are set forth in, or will be apparent to those of ordinary skill in the art from, the detailed description herein. Also, it should be further appreciated that modifications and variations to the specifically illustrated, referenced, and discussed steps, features, materials, or devices hereof may be practiced in various uses and embodiments of this invention without departing from the spirit and scope thereof, by virtue of present reference thereto. Such variations may include, but are not limited to, substitution of equivalent steps, materials, means, or features of those shown, referenced, or discussed, and the functional, operational, or positional reversal of various features, steps, parts, or the like.

Still further, it is to be understood that different embodiments, as well as different presently preferred embodiments, of this invention may include various combinations or configurations of presently disclosed steps, features, or elements, or their equivalents (including combinations of steps or features or configurations thereof not expressly shown in the figures or stated in the detailed description).

BRIEF DESCRIPTION OF THE DRAWINGS

The elements of the drawings are not necessarily to scale, emphasis instead being placed upon clearly illustrating the principles of the invention. Throughout the drawings, like numerals are used for like and corresponding parts of the various drawings.

DETAILED DESCRIPTION OF THE PREFERRED EMBODIMENTS

Reference will now be made in detail to presently preferred embodiments of the invention, examples of which are fully represented in the accompanying drawings. Such examples are provided by way of an explanation of the invention, not limitation thereof. In fact, it will be apparent to those skilled in the art that various modifications and variations can be made in the present invention, without departing from the spirit and scope thereof. For instance, features illustrated or described as part of one embodiment can be used on another embodiment to yield a still further embodiment. Still further, variations in selection of materials and/or characteristics may be practiced, to satisfy particular desired user criteria. Thus, it is intended that the present invention cover such modifications and variations as come within the scope of the present features and their equivalents.

Figure 1:
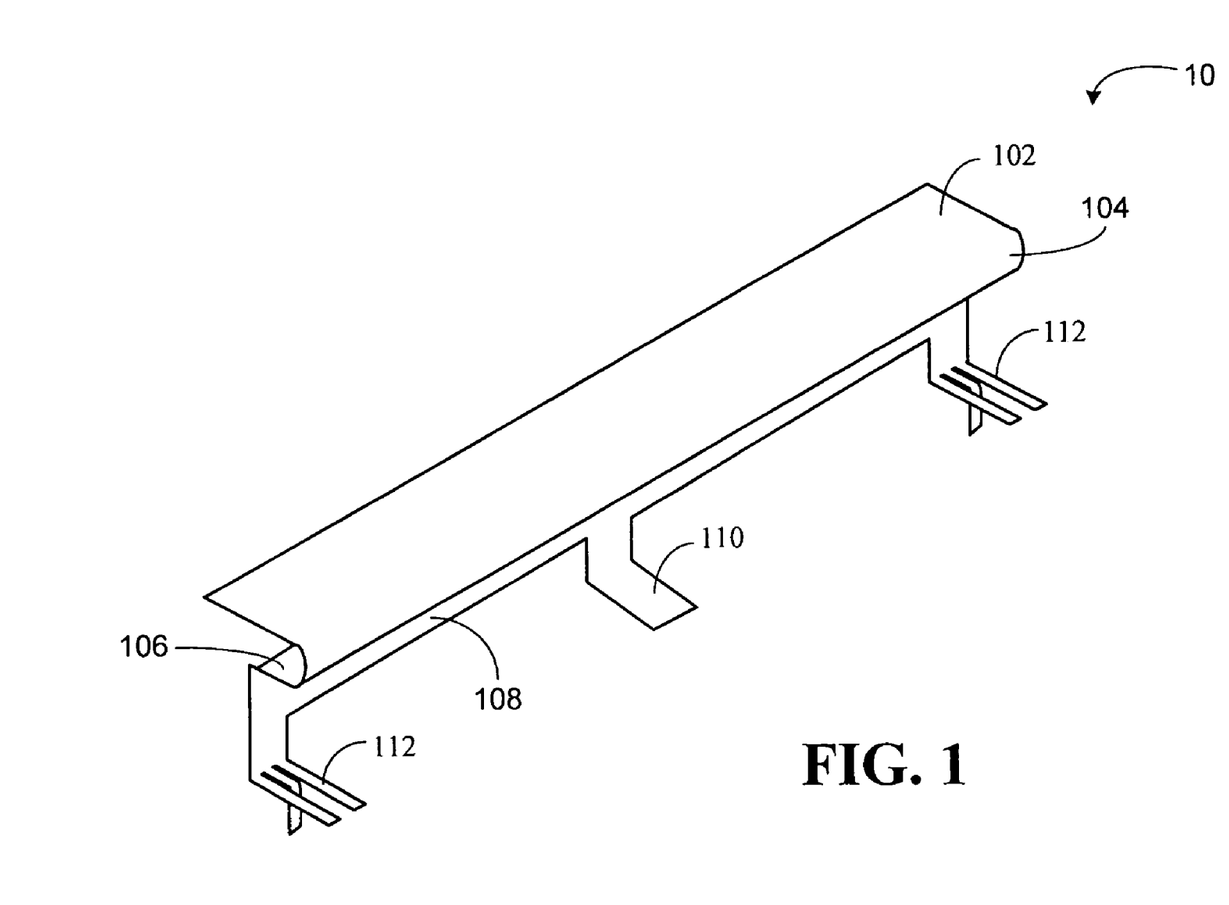
FIG. 1 illustrates a perspective view of an exemplary stiffener, according to one embodiment.

The present invention provides a printed circuit board (PCB) stiffener for overcoming the inherent structural flexibility of the PCBs used in modern electronics while simultaneously providing a design that does not interfere with the other components or electrical characteristics of the circuitry. FIG. 1 illustrates an exemplary PCB stiffener 10, in accordance with the present invention. Such stiffener 10 includes a first elongated horizontal member 102 having a generally horizontal upper surface with a curved elongated edge 104 and a second elongated horizontal member 106 rigidly coupled thereto. Said second elongated horizontal member 106 is rigidly coupled to said first elongated horizontal member 102 by way of said curved elongated edge 104 forming a generally U-shaped assembly.

Such exemplary stiffener 10 further includes a downwardly extending elongated vertical member 108 rigidly coupled to the edge of said second elongated horizontal member 106 which opposes said elongated curved edge 104 of said first elongated horizontal member 102. Such elongated vertical member 108 further comprises a plurality of legs extending downwardly therefrom. Extending generally perpendicular from each of said legs is a flange 110 or 112. Said flanges 110 and 112 extend in a direction toward said curved edge 104 and are suitable for connection to a surface of a printed circuit board.

In one exemplary embodiment, said plurality of flanges 110 and 112 comprise at least a first and a second flange 112 each positioned generally toward opposing extreme ends of the elongated vertical member 108. Said at least one first and one second flange 112 include a tab structure suitable for insertion into openings, typically plated through holes, in the printed circuit board. Such tab structure may be operable to be either soldered to the underside of the circuit board or folded to lie in a position substantially parallel to an underside of the circuit board. It should be noted that alternatively preferred embodiments of the present invention may include tab structures 110 or 112 that conform to any of the methods of physical attachment of a component to a printed circuit board presently known to those of ordinary skill in the art.

In the present exemplary embodiment, each of said at least one first and one second flange 112 include an area that has been prepared for coupling with the PCB. Preferably, such flanges 112 are tinned with a material capable of mechanically bonding the flange to the composite material of the PCB. Such tinning may be achieved by either hot-dipping the flanges 112 in solder or by electroplating a thin layer of a compatible material onto the flanges 112. By way of example, not limitation, such materials include copper, gold, lead, silver, as well as tin and its alloys, particularly tin/lead.

In another exemplary embodiment, the exemplary PCB stiffener 10 is provided with at least a third flange 110 generally centrally located along the length of the elongated vertical member 108. Said third flange 110 may include a tab structure as discussed above. Alternatively, said third flange 110 may include a generally flat surface for affixation to the upper surface of the printed circuit board by any of the methods known to those of ordinary skill in the art, including but not limited to soldering, gluing, or by the automated use of screws, rivets or grommets.

Figure 2:
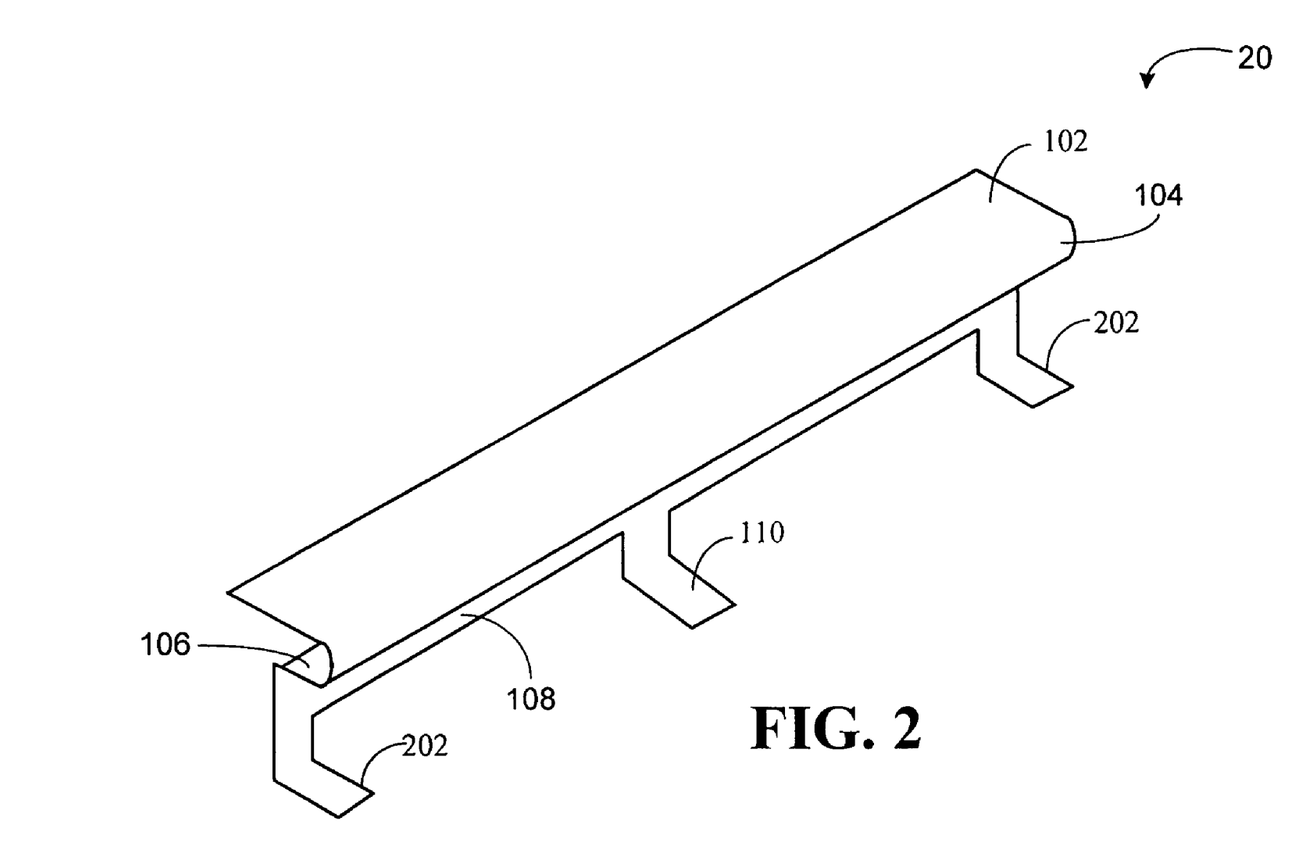
FIG. 2 illustrates a perspective view of an exemplary stiffener, according to another embodiment.

FIG. 2 illustrates a second alternatively preferred embodiment of an exemplary PCB stiffener 20 in which all of the flanges 110 and 202 include a generally flat surface for affixation to the upper surface of the printed circuit board. In still another alternative embodiment, the PCB stiffener may comprise more than three generally equal spaced flanges for coupling said stiffener to a printed circuit board.

In yet another alternative embodiment the flanges 202 generally located towards the extreme ends of the elongated vertical member 108 may provide a generally flat surface for affixation to the upper surface of the printed circuit board while the remaining flange 110 may provide a tab structure for insertion into openings in the printed circuit board. Such tab structure may be operable to be either soldered to the underside of the circuit board or folded to lie in a position substantially parallel to an underside of the circuit board.

Figure 3:
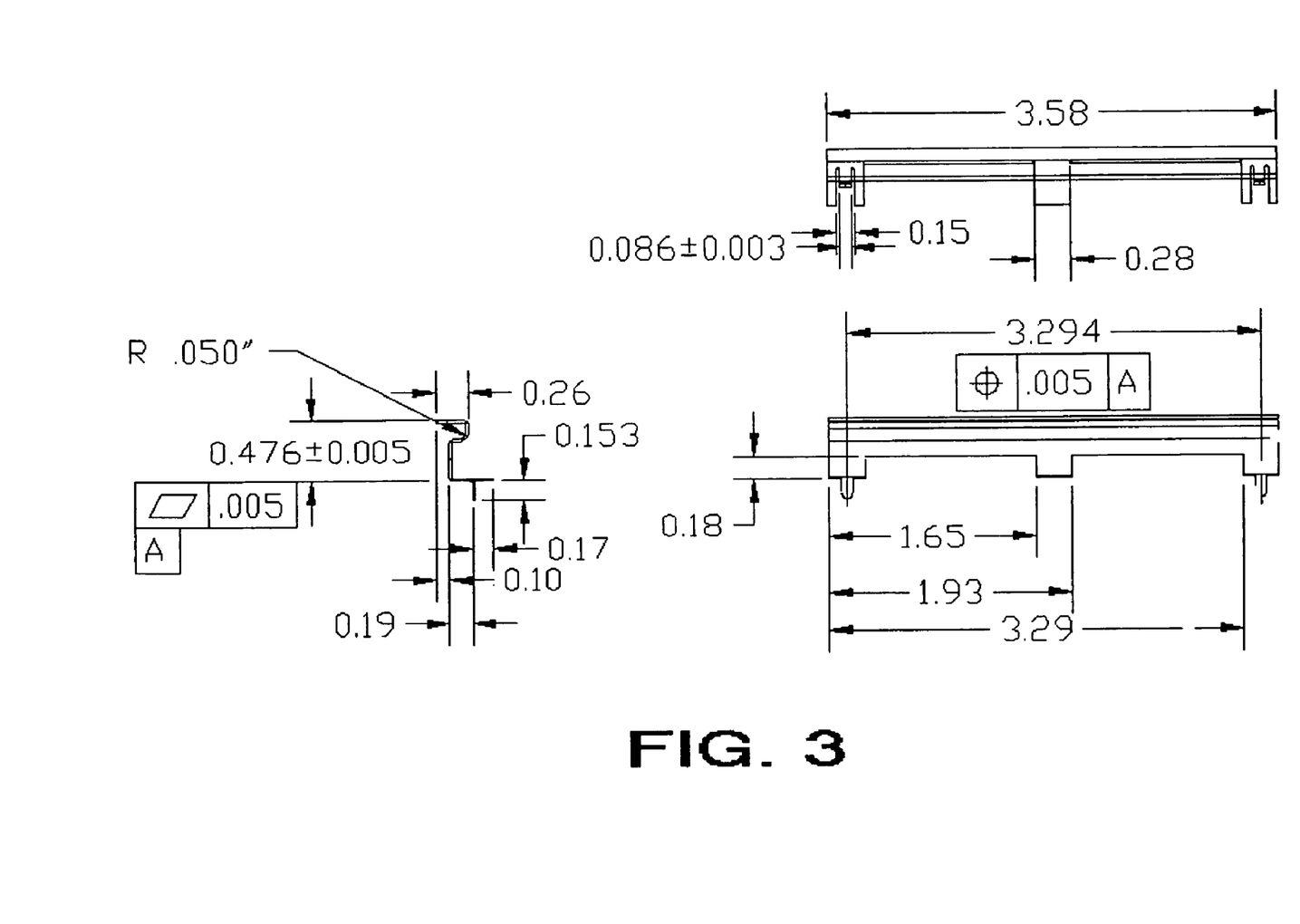
FIG. 3 illustrates multiple schematic views of an exemplary stiffener, according to one embodiment.

FIG. 3 illustrates an exemplary stiffener approximately three and one-half (3.5) inches in length and approximately one-half (0.5) inches in height. Such exemplary stiffener includes three flanges, the outer most two include tab-structured flanges and the inner flange including a generally flat surface for connection to the printed circuit board. It should be noted, the present invention may include any combination of a plurality of flanges, their general location and spacing along the elongated vertical member 108 and each flange's specific design for physical connection to the printed circuit board may vary. Further, the general dimensions for such a stiffener are directed by the layout of the electronic components located on the PCB, as well as the demands of the environment into which the PCB is to be located.

All of the above presently preferred embodiments provide a PCB stiffener 10 suitable for manufacturing via either a stamping, punched, drawn or a cold-formation process. Additionally, the stiffener 10 may be made of any material suitable for withstanding the higher temperatures of the printed circuit board assembly manufacturing process while providing the required structural rigidity needed to serve its design purpose. One such material is cold-rolled steel.

Further, the stiffener 10 is suitable for being moved, oriented, positioned and attached using known Surface Mount Technology (SMT) robotic machinery. In particular, the present invention is suitable for use with known gripper SMT placement machines. The PCB stiffener 10 has sufficient structural rigidity to be grasped either longitudinally (i.e., by either the elongated curved edge 104 and the elongated vertical member 108 or by the elongated curved edge 104 and the opposing edges of the first and second elongated horizontal members 102 and 106) or laterally (i.e., by the extreme opposing ends of both the first and second elongated horizontal members 102 and 106). Similarly, the generally horizontal upper surface of the first elongated horizontal member 102 provides sufficient surface area to make the present invention suitable for use with known vacuum SMT placement machines.

Figure 4:
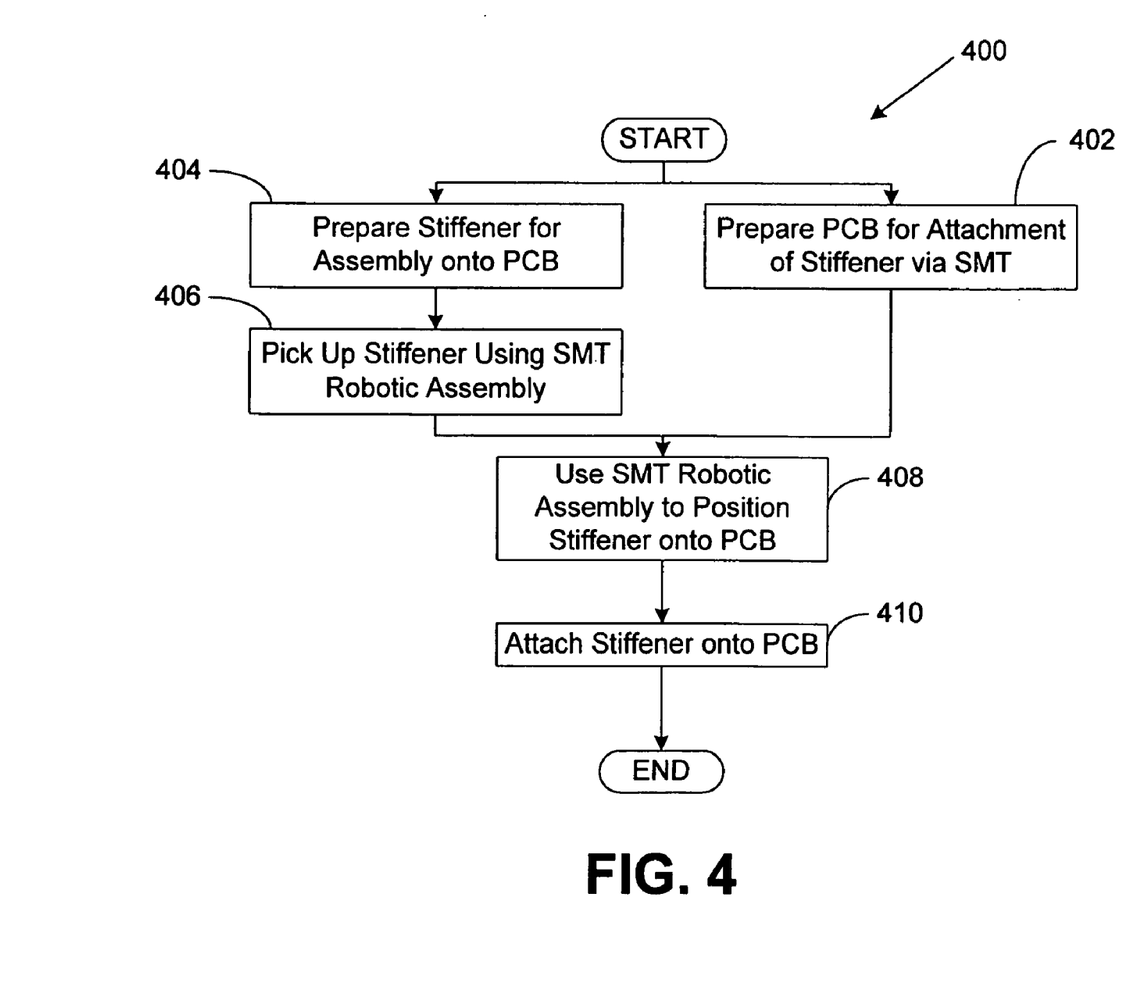
FIG. 4 is a flow chart of an exemplary method of attaching a stiffener to a PCB using SMT, according to one embodiment.

FIG. 4 illustrates a flowchart of an exemplary method 400 of attaching a stiffener to a printed circuit board using SMT. Initially, each of the component parts of the printed circuit board assembly must be prepared for attachment to each other. The PCB may be prepared 402 for the attachment of the stiffener by silk-screening the printed circuit board with solder paste thus providing a pattern of attachment points (a.k.a. pads) adequate to ensure sufficient contact surface for the placement of the stiffener 10. In the exemplary embodiments including flanges 112 with tab structures, such preparation 402 may include the silk-screening of both the upper and lower surfaces of the printed circuit board in order to provide the necessary solder paste to secure such flanges after their insertion into through holes in the PCB.

The PCB stiffener may be prepared 404 by tinning a portion of its flanges with a material suitable for ensuring a secure mechanical bond to the PCB. Such material may include copper, gold, lead, silver, as well as tin and its alloys, particularly tin/lead. Such tinning may be achieved by either hot-dipping the flanges 112 of the stiffener in solder or by electroplating a thin layer of the chosen tinning material onto the flanges 112. Such hot-dipping or electroplating of the flanges 112 serves to provide a clean, oxidation-free metal surface which will provide a superior mechanical bond to the printed circuit board.

Figure 5:
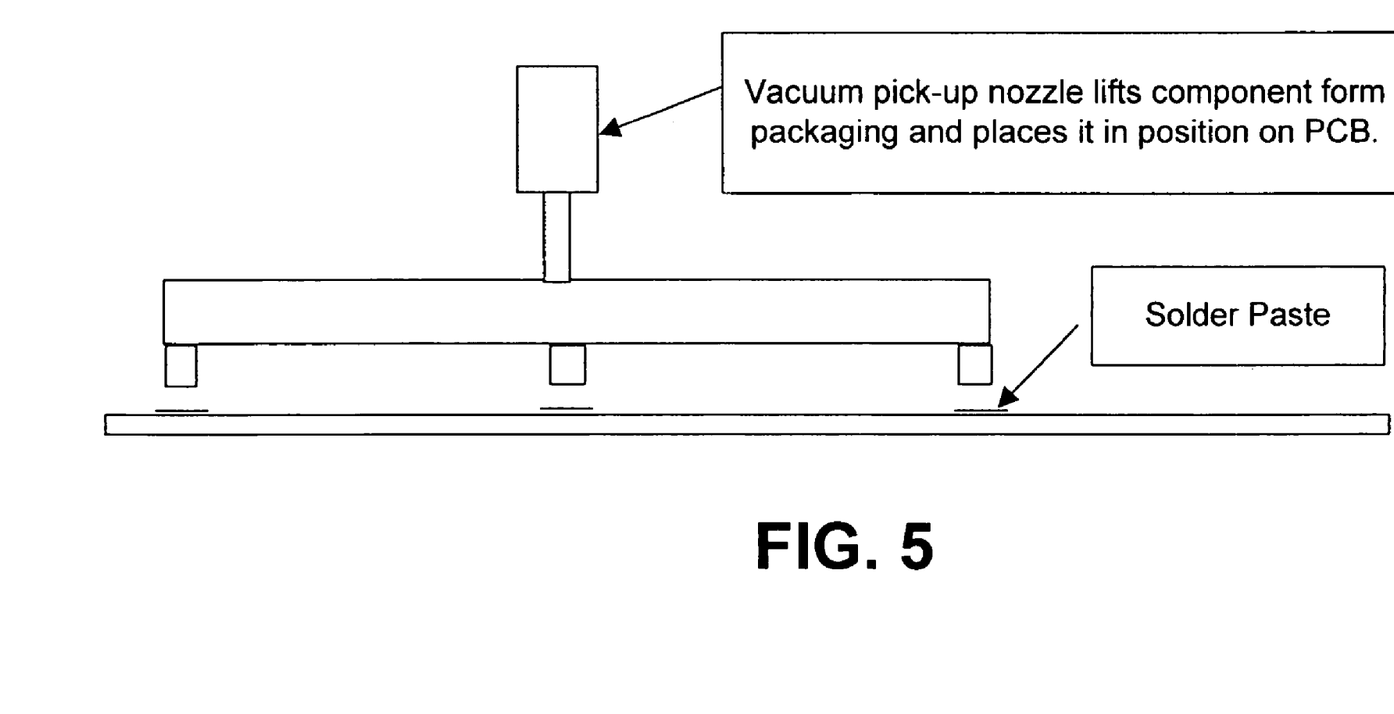
FIG. 5 illustrates a schematic view of an exemplary SMT robotic assembly positioning an exemplary stiffener for placement onto a PCB.

The next steps 406 and 408 in the present exemplary method 400 are moving and orienting the stiffener utilizing a SMT robotic assembly. All of the presently preferred exemplary embodiments are capable of operating with known grasping or vacuum SMT placement machines. Each such embodiment has sufficient structural rigidity to be grasped either longitudinally (i.e., by either the elongated curved edge 104 and the elongated vertical member 108 or by the elongated curved edge 104 and the opposing edges of the first and second elongated horizontal members 102 and 106) or laterally (i.e., by the extreme opposing ends of both the first and second elongated horizontal members 102 and 106). Similarly, as seen in FIG. 5, the generally horizontal upper surface of the first elongated horizontal member 102 provides sufficient surface area to be lifted by a vacuum nozzle affixed to a vacuum SMT placement machine.

Such SMT placement machines are capable of extremely precise placement of electronic components at locations anywhere across the PCB. In the present case, the SMT robotic assemblies insure proper alignment of the flanges 110 and 112 with their respective solder pads. Where the flanges 112 have tab structures, the SMT robotic assemblies also insure the passage of the tab structure into the through holes provided in the printed circuit board.

Figure 6:
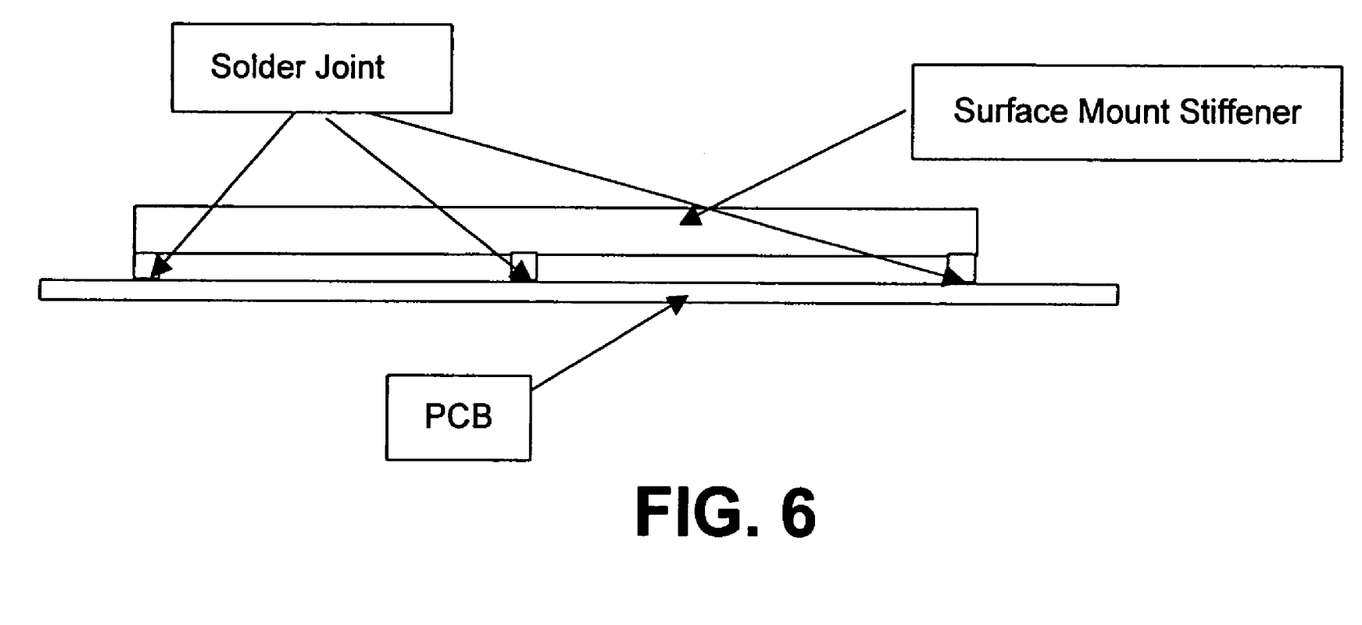
FIG. 6 illustrates a schematic view of an exemplary stiffener attached to a PCB, according to one embodiment.

Finally, the printed circuit board assembly (PCBA), the PCB with all its assorted electronic components and the stiffener, are processed 410 to complete the mechanical coupling between the parts. The design of the present invention allows for the processing 410 of the PCBA either by re-flow soldering or wave soldering of the stiffener to the PCB. In re-flow soldering, the PCB with all of its components is heated in an oven to produce fusion of the solder in the solder paste, which forms a mechanical bond between the components and the board, including the PCB stiffener. Alternatively, a wave soldering process may be used in which the board is passed over a bath of molten solder. FIG. 6 illustrates exemplary solder joints at the points of connection between the present invention and the PCB.

Figure 7:
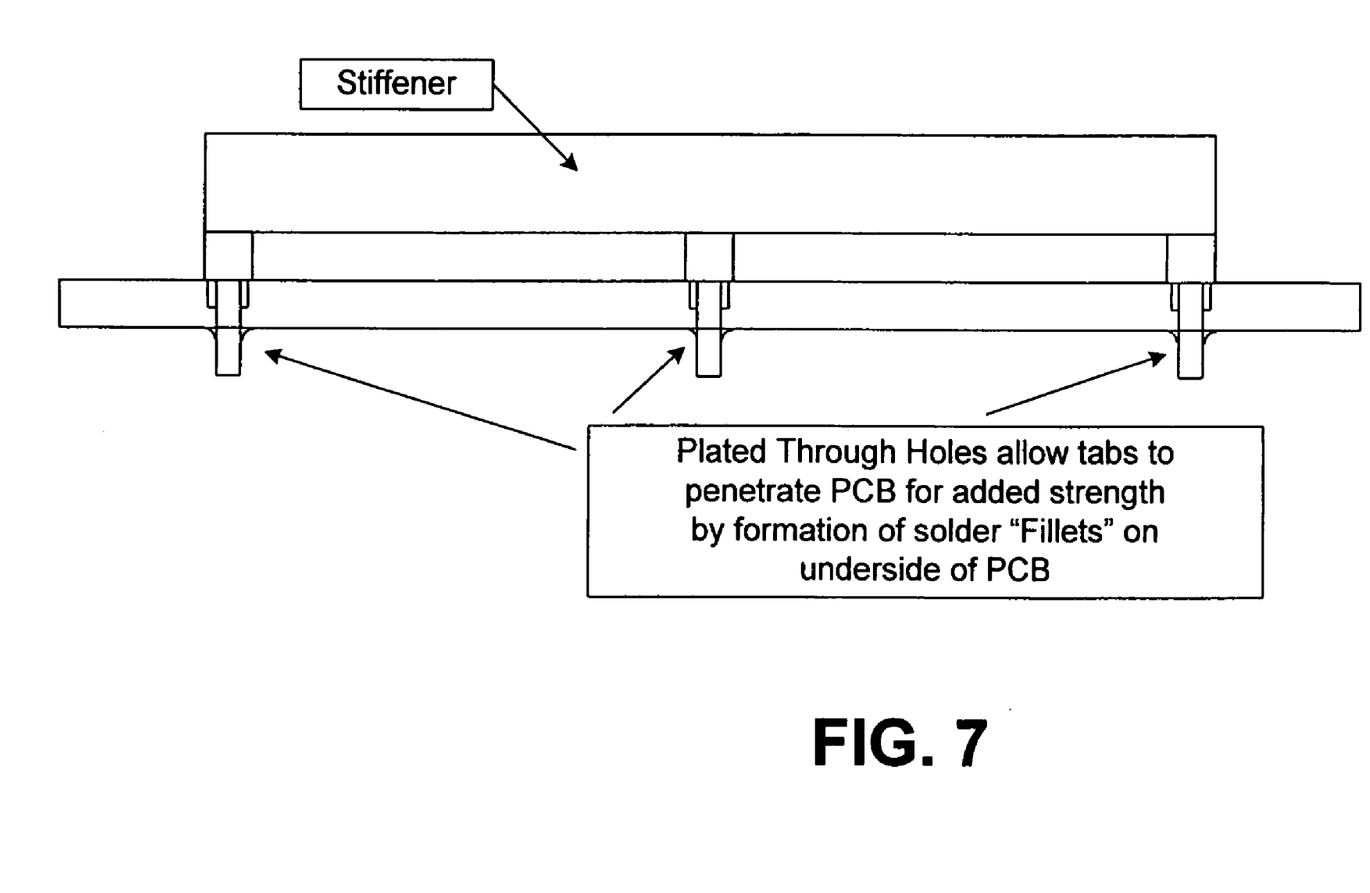
FIG. 7 illustrates a schematic view of an exemplary stiffener attached to a PCB, according to another embodiment.

Finally, FIG. 7 illustrates an exemplary PCB stiffener comprising three tab structured flanges 112 mounted and physically attached to a printed circuit board by a solder connection. In this exemplary embodiment, the through holes in the PCB through which the tab structures pass are plated. Generally, plated through holes are openings electrochemically coated with a conductive material, such as copper, along the inside diameter of the hole. This may allow for an electrical connection between copper pads and traces on opposite sides of the board as well as intermediate layers of multilayer boards. It also provides a path for solder migration due to capillary action through the hole to the opposite side of the board during wave soldering. It is this characteristic which may be used to enhance the mechanical attachment of a component such as the stiffener to the PCB assembly.

Further, enhancing the mechanical strength of the bond between the stiffener and the PCB is the formation of fillets in the solder joints therebetween. In particular a wave soldering process allows for the wicking of the melted solder paste into the through holes, as well as filling in the right angle interactions between the PCB and the tab structures on the underside of the PCB. The additional material at these right angle interactions typically form in smoothly-radiused curves known as fillets which aid in enhancing the mechanical strength of the bond between the PCB and the present invention.

Although several alternative preferred embodiments of the present invention have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged both in whole or in part. Therefore, the spirit and scope of the appended claims should not be limited to the description of the preferred versions contained herein.

What is claimed is:

1. A stiffener for stiffening a circuit board comprising:
a first elongated horizontal member having a substantially horizontal surface, the first elongated horizontal member having a curved edge along one elongated edge;
a second elongated horizontal member extending from and rigidly coupled to the curved edge of the first elongated horizontal member; the second elongated horizontal member positioned below and substantially parallel to the first elongated horizontal member;
an elongated vertical member extending downward from and rigidly coupled to the second elongated horizontal member at an elongated edge of the second elongated horizontal member that is substantially opposite the curved edge coupling the first and second elongated horizontal members, the elongated vertical member having a plurality of legs extending from the elongated vertical member; and
a plurality of flanges respectively extending from and rigidly coupled to the plurality of legs, the plurality of flanges being substantially perpendicular to its respective plurality of legs, the plurality of flanges extending in a direction toward the curved edge, the plurality of flanges being suitable for attaching to a surface of said circuit board.

2. The stiffener of claim 1, wherein at least one of the plurality of flanges includes a tab suitable for insertion into an opening in the circuit board.

3. The stiffener of claim 2, wherein the tab is operable to be soldered to an underside of the circuit board.

4. The stiffener of claim 2, wherein the tab is operable to be folded to lie in a position substantially parallel to an underside of the circuit board.

5. The stiffener of claim 1, wherein the plurality of flanges comprises at least a first flange and a second flange, the first flange being positioned toward a first end of the elongated vertical member and the second flange being positioned toward a second end of the elongated vertical member.

6. The stiffener of claim 1, wherein at least one of the plurality of flanges includes an area that has been tinned.

7. The stiffener of claim 6, wherein at least one of the plurality of flanges includes an area that has been tinned with a layer of tin.

8. The stiffener of claim 6, wherein at least one of the plurality of flanges includes an area that has been tinned with a layer of tin/lead alloy.

9. The stiffener of claim 6, wherein at least one of the plurality of flanges includes an area that has been tinned with a layer of solder.

10. The stiffener of claim 1, wherein the plurality of flanges are suitable for being soldered to said surface of a circuit board.

11. The stiffener of claim 1, wherein the substantially horizontal surface is suitable for coupling to a vacuum nozzle affixed to a surface mount technology placement machine.

12. The stiffener of claim 1, wherein the curved edge and the elongated vertical member are suitable of being grasped by a gripper affixed to a surface mount technology placement machine.

13. The stiffener of claim 1, wherein the curved edge and a second elongated edge of the first elongated horizontal member are suitable for being grasped by a gripper affixed to a surface mount technology placement machine, the second elongated edge being substantially opposite the curved edge.

14. The stiffener of claim 1, wherein said stiffener apparatus is made from cold rolled steel.

15. The stiffener of claim 1, wherein said stiffener is suitable for manufacture via a stamping process.

* * * * *